(12) United States Patent
Shah et al.

(10) Patent No.: US 7,871,247 B2
(45) Date of Patent: Jan. 18, 2011

(54) HIGH MODULUS METALLIC COMPONENT FOR HIGH VIBRATORY OPERATION

(75) Inventors: Dilip M. Shah, Glastonbury, CT (US); Alan D. Cetel, West Hartford, CT (US); Alan W. Stoner, Tullahoma, TN (US); William P. Allen, Plainfield, IL (US)

(73) Assignee: United Technologies Corporation, Hartford, CT (US)

( * ) Notice: Subject to any disclaimer, the term of this patent is extended or adjusted under 35 U.S.C. 154(b) by 517 days.

(21) Appl. No.: 11/840,330

(22) Filed: Aug. 17, 2007

(65) Prior Publication Data

US 2009/0297359 A1  Dec. 3, 2009

Related U.S. Application Data

(62) Division of application No. 10/791,421, filed on Mar. 2, 2004, now Pat. No. 7,338,259.

(51) Int. Cl.
*F01D 5/28* (2006.01)

(52) U.S. Cl. .............. 416/241 R; 416/223 A; 416/500; 428/678; 428/680; 148/404; 148/428; 148/675; 420/444; 164/122.1; 164/122.2

(58) Field of Classification Search ............... 415/200; 416/241 R, 223 A, 500; 428/678, 680; 148/404, 148/428, 675; 420/444; 164/122.1, 122.2
See application file for complete search history.

(56) References Cited

U.S. PATENT DOCUMENTS

| 1,793,672 | A | 2/1931 | Bridgman |
|---|---|---|---|
| 3,572,733 | A | 3/1971 | Howald |
| 3,712,368 | A | 1/1973 | Phipps |
| 3,857,436 | A | 12/1974 | Petrov et al. |
| 4,116,723 | A | 9/1978 | Gell |
| 4,475,582 | A | 10/1984 | Giamei |
| 4,518,442 | A | 5/1985 | Chin |
| 4,529,452 | A | 7/1985 | Walker |
| 4,612,969 | A | 9/1986 | Burd |
| 4,719,080 | A | 1/1988 | Duhl |
| 4,915,907 | A | 4/1990 | Shah |
| 4,921,405 | A | 5/1990 | Wilson |
| 5,062,469 | A | 11/1991 | Monte |
| 5,113,583 | A | 5/1992 | Jenkel et al. |
| 5,275,228 | A | 1/1994 | Wottmann |

(Continued)

FOREIGN PATENT DOCUMENTS

DE  10033688  1/2002

(Continued)

OTHER PUBLICATIONS

European Search Report dated Oct. 7, 2008.

*Primary Examiner*—Christopher Verdier
(74) *Attorney, Agent, or Firm*—Carlson, Gaskey & Olds

(57) ABSTRACT

A high modulus component, such as an aircraft engine turbine blade, is formed from a base metal that has a high modulus crystallographic orientation that is aligned with the primary, i.e. radial, direction of the turbine blade. The base metal is Ni, Fe, Ti, Co, Al, Nb, or Mo based alloy. Alignment of a high modulus direction of the base metal with the primary direction provides enhanced high cycle fatigue life.

17 Claims, 2 Drawing Sheets

U.S. PATENT DOCUMENTS

| | | |
|---|---|---|
| 5,292,385 A | 3/1994 | Kington |
| 5,346,184 A | 9/1994 | Ghosh |
| 5,843,586 A | 12/1998 | Schaeffer et al. |
| 6,497,272 B1 | 12/2002 | Maslen |
| 6,557,618 B1 | 5/2003 | Kablov |
| 6,568,456 B1 | 5/2003 | Fernihough |
| 7,338,259 B2 * | 3/2008 | Shah et al. ............ 416/241 R |
| 2002/0074102 A1 | 6/2002 | Wang |

FOREIGN PATENT DOCUMENTS

| | | |
|---|---|---|
| EP | 059549 | 9/1982 |
| EP | 066971 | 12/1982 |
| EP | 100150 | 2/1984 |
| EP | 0637476 | 2/1995 |
| EP | 1217170 | 6/2002 |
| JP | 57-199559 | 7/1982 |

* cited by examiner

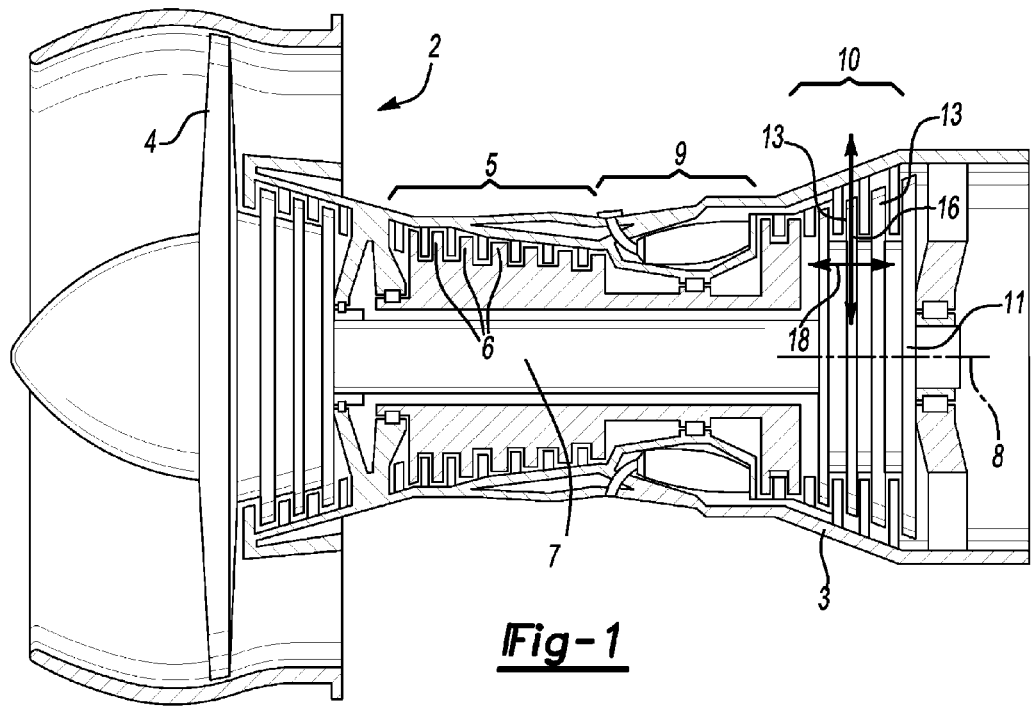
*Fig-1*
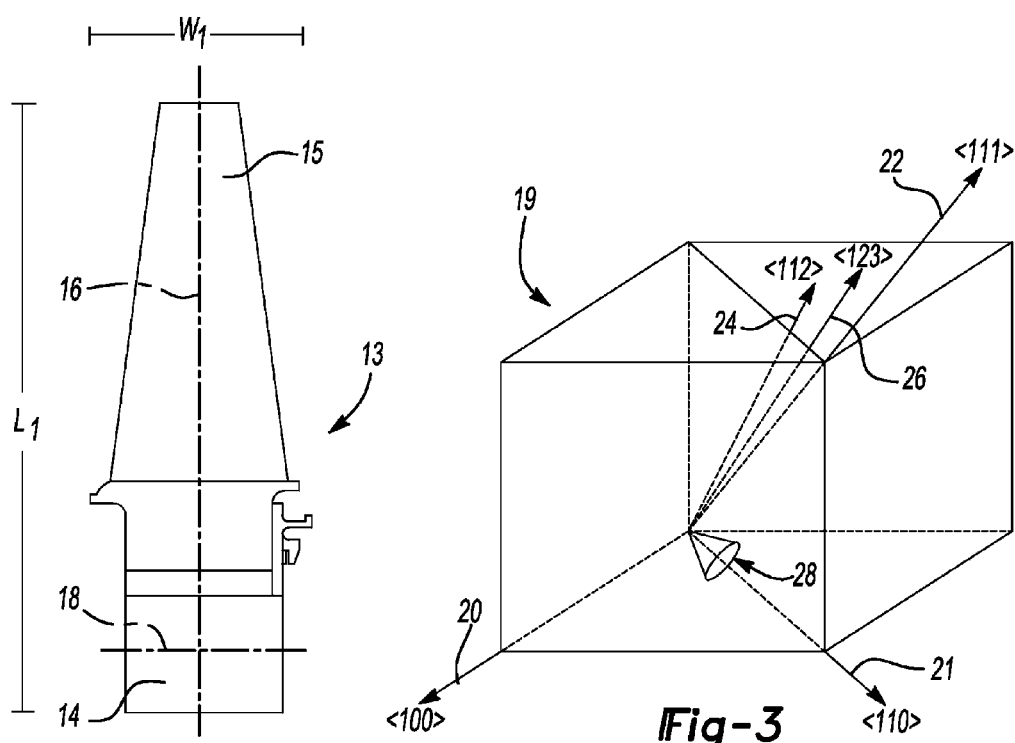
*Fig-2*
*Fig-3*

HIGH MODULUS METALLIC COMPONENT FOR HIGH VIBRATORY OPERATION

This application is a divisional of U.S. Pat. No. 7,338,259, which was filed Mar. 2, 2004.

This invention was made with government support under Contract No. N00019-02-C-3003 awarded by the Department of the Navy. The government therefore has certain rights in this invention.

BACKGROUND OF THE INVENTION

This invention relates to a metallic component such as an aircraft engine turbine blade that is formed with a high modulus orientation of a metal being aligned in the radial, i.e. primary, direction of the turbine blade.

Machines that utilize high speed components, such as an aircraft engine, produce high frequency vibrations. The high frequency vibrations are typically on the order of kilohertz and impose a variety of fluctuating high cycle fatigue stresses on the high speed components of the machine. Often, the limiting factor in the life of a high speed component is high cycle fatigue stress. While the present invention is described in the context of a turbine blade, it will be recognized that the invention is not so limited.

Conventionally, the life of high speed components, such as a turbine blade employed in aircraft engine, is enhanced by designing the component to resist or minimize the imposed stresses. This involves designing the turbine blade so that the natural vibrational frequencies do not match the vibrational frequencies produced by the high speeds. A turbine blade designed in this way minimizes the stress amplitude by avoiding a resonant effect that amplifies the stresses. It is not always possible however, to design a blade that has adequately different natural vibrational frequencies from those produced by the high speed motion.

Another turbine blade design approach attempts to dampen the vibrations at critical locations on the blade. Various damping designs, such as friction damping or the application of damping coatings, are available to help reduce the stress amplitude at the critical locations. Damping is often expensive, involves highly complex analysis and experimentation, and may impair the performance of the turbine blade.

Accordingly, a metallic component, such as aircraft engine turbine blade, that provides enhanced high cycle fatigue life is needed.

SUMMARY OF THE INVENTION

In general terms, this invention is a directionally solidified metallic component, such as an aircraft engine turbine blade that is formed from a base metal that has a high modulus crystallographic orientation aligned with the radial, i.e. primary, direction of the turbine blade.

In one example, the engine turbine blade is formed from a single crystal of Ni based alloy and the <111> crystallographic direction is aligned with the primary direction of the turbine. Alternatively, the engine turbine blade is formed from an alloy of Fe, Ti, Al, Co, Nb, or Mo and a high modulus direction of the alloy is aligned with the primary direction of the turbine blade.

In another example, a high modulus direction of the base metal that forms the engine turbine blade is aligned with the primary direction of a columnar grain structure and the primary direction of the columnar grain structure is aligned with the primary direction of the turbine blade.

In another example, the engine turbine blade is formed from a Ni based alloy and the <112> high modulus crystallographic direction is aligned within a cone of about ten degrees of the primary direction of the turbine blade.

In another example, the engine turbine blade is formed from a Ni based alloy and the <123> high modulus crystallographic direction is aligned within a cone of about ten degrees of the primary direction of the turbine blade.

In another example, the engine turbine blade is formed from a Ni based alloy and the <110> crystallographic direction is aligned to within about ten degrees of the primary direction.

In another example, the Ni base metal that forms the engine turbine blade that has a high modulus direction aligned with the primary direction is a Ni superalloy.

In another example, the engine turbine blade turbine blade is heat treated to recrystallize the base metal with a high modulus direction aligned with the primary direction of the turbine blade.

In another example, the engine turbine blade that has a high modulus direction aligned with the primary direction is in an aircraft engine.

The various features and advantages of this invention will become apparent to those skilled in the art from the following detailed description of the currently preferred embodiment. The drawings that accompany the detailed description can be briefly described as follows.

BRIEF DESCRIPTION OF THE DRAWINGS

FIG. 1 is a cross sectional view of an aircraft engine.

FIG. 2 is a schematic cross sectional view of an aircraft engine turbine blade;

FIG. 3 is a sketch of a single crystal unit of a base metal;

DETAILED DESCRIPTION OF THE PREFERRED EMBODIMENT

Figure 4:
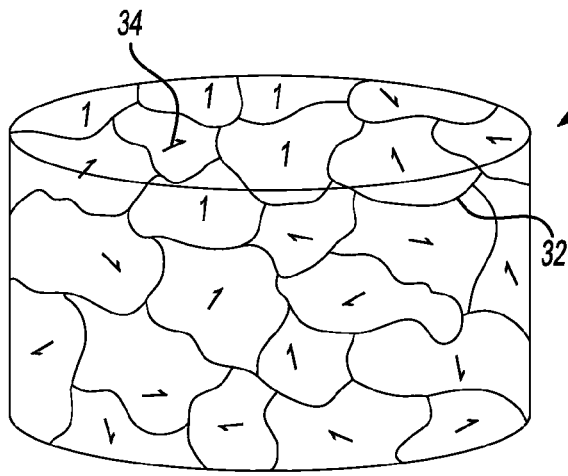
FIG. 4 is a microscopic sketch of an equiaxed Ni metal portion.

FIG. 1 shows a cross sectional schematic view of an aircraft engine 2. The aircraft engine 2 includes an engine casing 3 that houses a fan 4 that is in fluid communication with a compressor 5. The compressor 5 includes impellers 6 that pressurize air in the aircraft engine 2. The impellers 6 are attached to a rotatable shaft 7 that rotates around axis 8. When the shaft 7 rotates, the impellers 6 rotate. A combustor 9 is in fluid communication with pressurized gas that exits from the compressor 5. The combustor 9 combusts the pressurized gas. A turbine 10 receives the combusted pressurized gas and converts it into energy that is used to rotate the shaft 7 and power the compressor 5. The turbine 10 includes a rotor 11 that is attached to the shaft 7, and turbine blades 13 that are attached to the rotor 11.

Inside the aircraft engine 2, the turbine blades 13 operate at high rotational speeds as the combusted pressurized gas from the combustor 9 expands. The high speeds cause vibrations in the aircraft engine 2 and impose high frequency fatigue stresses on the turbine blades 13, i.e. high cycle fatigue.

Referring to FIG. 2, the turbine blade 13 has base portion 14 and tip portion 15. The turbine blade 13 further includes an associated primary direction 16 that extends from the base portion 14 to the tip portion 15 and a substantially perpendicular axial direction 18. The turbine blade 13 has a dimension $L_1$ in the primary direction and a dimension $W_1$ in the axial direction. The dimension $L_1$ is greater than the dimension $W_1$. That is, the turbine blade 13 has a $L_1$ to $W_1$ aspect ratio greater than one. The primary direction 16 is defined as the direction of the greater dimension $L_1$ in the turbine blade 13, or the greater dimension of any component having an aspect ratio that is greater than one.

The axial direction 18 is approximately the same direction of the axis 11 (referring to FIG. 1) around which the turbine blade 13 rotates. The primary direction 16 is substantially perpendicular (i.e. radial relative to the axis 11 about which the turbine blade 13 rotates—see FIG. 1). A significant amount of fatigue stress occurs in the primary direction 16 due to the high speed rotation of the turbine blade 13 around the axis 11.

The turbine blade 13 is formed from a base metal. A base metal is the primary metal of an alloy and may include substantial amounts of alloying elements. All alloys and metals are crystalline and therefore have an associated crystal structure.

The example in FIG. 3 refers to a sketch of a single crystal unit of the crystal structure of a base metal used, for example, to form the aircraft engine turbine blade 13. The single crystal unit 19 has known crystallographic directions, for example the <100> direction represented by the line 20, <110> represented by the line 21, <111> represented by the line 22, <112> represented by the line 24, and <123> represented by the line 26. For engineering purposes, the crystallographic direction refers to the approximate coordinate direction within about a ten degree cone angle 28 of the exact direction.

Each crystallographic direction also has an associated elastic modulus and, if at least one of the crystallographic directions has an elastic modulus that is not equal to the elastic moduli in the other crystallographic directions, the single crystal unit 19 is anisotropic with respect to elastic modulus.

In one example, a Ni based alloy is the base metal. At room temperature, in the <100> crystallographic direction the Ni based alloy has an elastic modulus of about 20 Mpsi, in the <110> crystallographic direction an elastic modulus of about 34 Mpsi, and in the <111> crystallographic direction an elastic modulus of about 44 Mpsi. The <100> is a low modulus direction because it has a lower modulus than another direction (here either the <110> or <111> directions) and the <111> is a high modulus direction because it has a higher modulus than at least one other direction (<110> or <100>). For the single crystal unit 19, the Ni based alloy is anisotropic.

Generally, despite anisotropy, an article or component formed from an anisotropic base metal will not always exhibit anisotropic properties such as for elastic modulus.

For example, FIG. 4 shows a microscopic sketch of a known equiaxed Ni based alloy portion 30 of an article that was solidified in an uncontrolled manner during forming of the article, e.g. without a heat gradient. The equiaxed Ni based alloy portion 30 is comprised of grains 32. Each grain 32 has a crystallographic orientation 34 corresponding to a crystallographic direction such as referred to in FIG. 1 for example. The crystallographic orientations 34 of the grains 32 are randomly oriented, i.e. equiaxed. Therefore, the elastic modulus and other properties of the equiaxed Ni based alloy portion 30 are the same in all directions.

Figure 5:
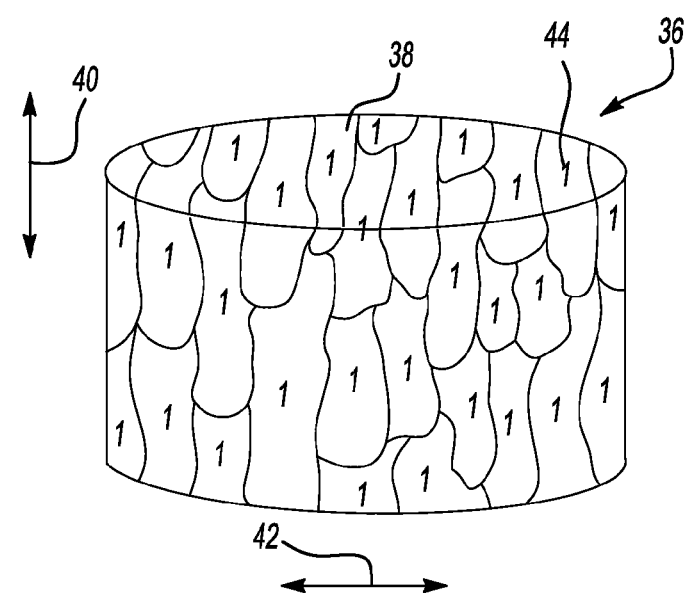
FIG. 5 is a microscopic sketch of an anisotropic Ni metal portion.

FIG. 5, however, shows an anisotropic Ni based alloy portion 36 of an article or component that was solidified in a controlled manner during forming, e.g. with a controlled heat gradient. The anisotropic Ni based alloy portion 36 is comprised of a columnar grain 38 structure having a primary direction 40 and a transverse direction 42. Each columnar grain 38 has a crystallographic orientation 44 that is aligned in the primary direction 40. The elastic modulus and other properties of the anisotropic Ni based alloy portion 36 are therefore different in the primary direction 40 than in the transverse direction 42.

Figure 6:
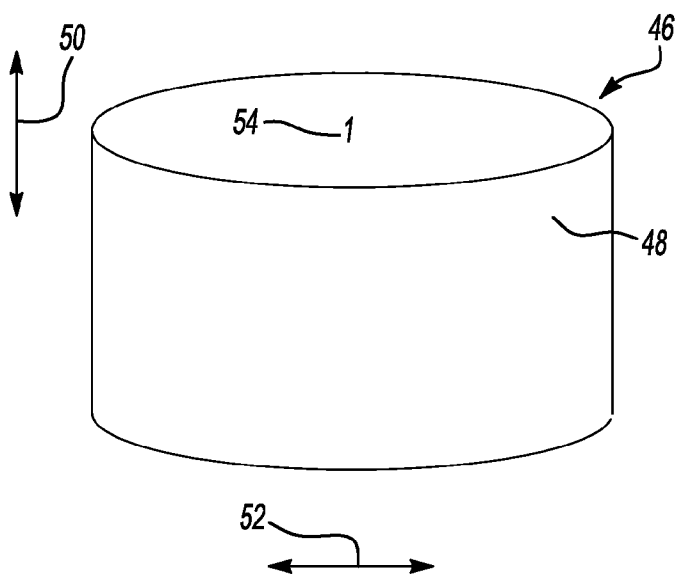
FIG. 6 is a microscopic sketch of a single crystal Ni metal portion.

As shown in FIG. 6, a single crystal Ni based alloy portion 46 also exhibits anisotropic properties. The single crystal Ni based alloy portion 46 was solidified in a controlled manner using the known process of seeding, for example. The single crystal Ni based alloy portion 46 contains a single crystal 48 structure having a primary direction 50 and transverse direction 52. The single crystal 48 has a crystallographic orientation 54 that is aligned in the primary direction 50. The properties of the single crystal Ni based alloy portion 48 are therefore different in the primary direction 50 than in the transverse direction 52.

As referred to for FIG. 5, the anisotropic Ni based alloy portion 36 was solidified in a controlled manner during forming. For example, the known process of investment casting may yield columnar grain 38 structure because of a cooling gradient during the solidification process. This process results naturally in the columnar grains 38 having a crystallographic orientation 44 in the <100> low modulus direction (i.e. the primary direction 46). Since Ni based alloy metal has an elastic modulus of about 20 Mpsi in the <100> direction, the anisotropic Ni based alloy portion 36 has an elastic modulus of about 20 Mpsi in the primary direction 40.

As referred to for FIG. 6, the single crystal Ni based alloy portion 46 was solidified in a controlled manner during forming. For example, the known process of investment casting using a seed may be used to produce the single grain 48. This process results naturally in the single grain 48 having a crystallographic orientation 54 in the <100> low modulus direction (i.e. the primary direction 46). Since Ni based alloy has an elastic modulus of about 20 Mpsi in the <100> direction, the single crystal Ni based alloy portion 46 has an elastic modulus of about 20 Mpsi in the primary direction 50.

In one preferred example, a Ni based alloy is used as the base metal forming the turbine blade 13 and has the <111> crystallographic direction aligned with the primary direction 16. Ni based alloy is preferred, but alloys of Fe, Co, Mo, Ti, Nb, and Al could alternatively be used. As is known, a high modulus direction for cubic crystal structured metals, such as Ni, is the <111> direction, but one skilled in the art would recognize the high modulus directions in base metals having other crystal structures as well as other high modulus directions in cubic crystal structured metals. It should be understood that one of ordinary skill in the art who has the benefit of this disclosure would recognize the applicability of aligning a high modulus direction with a primary direction to articles other than an aircraft turbine blade such as, but not limited to, industrial gas turbines, aircraft compressor blades, and generally any high speed component having an aspect ratio greater than one.

In another example the base metal of the turbine blade 13 has a columnar grain 38 structure. A high modulus direction of the base metal is aligned with the primary direction 40 of the columnar grains 38. The primary direction 40 of the columnar grains 38 is aligned with the primary direction 16 of the turbine blade 13.

In another preferred example, the base metal has a single grain 48 structure. A high modulus direction of the base metal is aligned with the primary direction 50 of the single grain 48. The primary direction 50 of the single grain 48 is aligned with the primary direction 16 of the turbine blade 13.

In another example a Ni based alloy forms the aircraft engine turbine blade 13 and the <112> high modulus direction is aligned to within about a ten degree cone angle 28 of the primary direction 16.

In another example a Ni based alloy forms the aircraft engine turbine blade 13 and the <123> high modulus direction is aligned to within about a ten degree cone angle 28 of the primary direction 16.

In another example a Ni based alloy forms the aircraft engine turbine blade 13 and the <110> high modulus direction is aligned to within about a ten degree cone angle 28 of the primary direction 16.

In another example, the Ni base metal is a known superalloy. The composition of the superalloy is 1-16% Cr, 0-3% Mo, 3-13% W, 0-8% Re, 0-14% Ta, 3-7% Al, 0-20% Co, 0-0.1% C, 0-0.02% B, 0-0.1% Zr, 0-2% Hf, 0-2% Nb, 0-1% V, 0-2% Ti, 0-10% (Ru+Rh+Pd+Os+Ir+Pt), 0-0.25% Y, and the balance Ni. In this composition 0-10% (Ru+Rh+Pd+Os+Ir+Pt) means a mixture of any or all of the six elements but not exceeding 10%. This composition is known in the aircraft industry to be adequate for forming turbine blades that have the low modulus <100> direction aligned with the primary direction of the blade but not for any high modulus directions such as <123>, <112> and <111>. One specific superalloy for the high modulus turbine blade 13 is of the composition 5.0% Cr, 10% Co, 2.0% Mo, 6.0% W, 3.1% Re, 5.6% Al, 9.0% Ta, 0.1% Hf, and the balance Ni. Another specific superalloy for the high modulus turbine blade 13 is of the composition 2.0% Cr, 16.5% Co, 2.0% Mo, 6.0% W, 6.0% Re, 3.0% Ru, 5.65% Al, 0.15% Hf, 0.004% B, 0.05% C, and the balance Ni.

An aircraft engine turbine blade 13 that has a high modulus direction aligned in the primary direction 16 is particularly well suited to lower stresses imposed by high cycle engine vibration, i.e. high cycle fatigue. In one example, the engine turbine blade 13 is formed with a Ni based alloy and has the <111> direction aligned with the primary direction 16. The engine turbine blade 13 has a higher natural vibration frequency than a turbine blade that has the <100> direction aligned with the primary direction 16. This results in a reduction in stress amplitude from high cycle vibrations and thus enhanced high cycle fatigue life.

An aircraft engine turbine blade 13 that has a high modulus direction aligned in the primary direction 16 is counter to the current practice in the industry. Current practice utilizes aircraft engine turbines that have the low modulus direction <100> aligned with the primary direction 16 because the investment casting forming process naturally produces the <100> direction aligned with the primary direction 16. Moreover, the low modulus direction <100> was thought to be the best design because it exhibits other favorable properties such as thermal mechanical fatigue resistance.

A known investment casting method of forming can be utilized to produce an aircraft engine turbine blade 13 that has a high modulus direction aligned in the primary direction 16. Generally, investment casting involves pouring a molten metal into a mold and cooling the mold in a controlled manner so that that the molten metal solidifies in a controlled manner. This processing method can be used to align a high modulus direction with the primary direction 16. Those skilled in the art of metal forming would recognize the processing steps required to produce an engine turbine blade according to the invention. That is, a turbine blade having high modulus properties is novel and inventive, however, a worker of ordinary skill in the art would know of the investment casting process to produce it.

A seed may also be used in the investment casting process to produce a component with a single crystal structure rather than a columnar grain structure. For example, a <111> oriented Ni seed would be used to induce single crystal growth in the <111> direction for investment casting a single crystal Ni base metal turbine blade 13 that has the <111> direction aligned with the primary direction 16. It should be understood that, while a turbine having high modulus properties is novel and inventive, the methods of investment casting and seeding are known to those of ordinary skill in the art of metal forming, the details of which are hereby incorporated by reference.

A turbine blade 13 that has a high modulus direction aligned in the primary direction 16 can also be formed by a known machining process. In the machining process, the aircraft engine turbine blade 13 is machined from a cast ingot. The ingot is cast, for example, with a <100> direction. The primary direction 16 of the turbine blade 13 is machined at approximately a fifty-four degree angle to the ingot <100> direction. This results in the <111> high modulus direction being aligned with the primary direction 16.

The turbine blade 13 that has a high modulus direction aligned in the primary direction 16 can also be formed by the known process of tilting the component during casting. During solidification, the aircraft engine turbine blade 13 may be tilted at a particular angle relative to the direction of a cooling gradient so that the high modulus direction is aligned with the primary direction 16.

The turbine blade 13 that has a high modulus direction aligned in the primary direction 16 can also be formed by the known process of recrystallization. Recrystallization involves heat treating a cast or wrought turbine blade to form new grains from the grains that already existed before the heat treatment. The new grains have a high modulus direction aligned with the primary direction 16.

The invention has been described in an illustrative manner, and it is to be understood that the terminology used is intended to be in the nature of words of description rather than of limitation. Obviously, many modifications and variations of the present invention are possible in light of the above teachings. It is, therefore, to be understood that within the scope of the appended claims the invention may be practiced otherwise than as specifically described.

We claim:

1. A high modulus turbine blade comprising:
   a base portion and a tip portion;
   a primary direction that extends from said base portion to said tip portion; and
   said turbine blade being formed of a base metal that has a crystallographic orientation, said crystallographic orientation having a high modulus direction, wherein said high modulus direction is aligned with said primary direction and is within either about ten degrees of the <112> crystallographic direction or about ten degrees of the <123> crystallographic direction, wherein said base metal is a nickel-based alloy composition comprising 1-16% Cr, a nonzero amount of 0-3% Mo, 3-13% W, a nonzero amount of 0-8% Re, a nonzero amount up to 14% Ta, 3-7% Al, a nonzero amount up to 20% Co, a nonzero amount up to 2% Hf, a nonzero amount up to 2% Ti, a nonzero amount up to 2% Nb, a nonzero amount up to 1% V, a nonzero amount up to 10% of at least one of Ru, Rh, Pd, Os, Ir, or Pt, a nonzero amount up to 0.25% Y, and the balance Ni.

2. The turbine blade as recited in claim 1, wherein said high modulus direction is aligned to within a cone of about ten degrees of said primary direction.

3. The turbine blade as recited in claim 1, wherein said nickel-based alloy composition comprises 5.0% of the Cr, 10% of the Co, 2.0% of the Mo, 6.0% of the W, 3.1% of the Re, 5.6% of the Al, 9.0% of the Ta, and 0.1% of the Hf.

4. The turbine blade as recited in claim 1, wherein said base metal comprises recrystallized grains.

5. The turbine blade as recited in claim 1, wherein said nickel-based alloy composition additionally comprises a nonzero amount up to 0.1% C, a nonzero amount up to 0.02% B, and a nonzero amount up to 0.1% Zr.

6. The turbine blade as recited in claim 1, wherein said nickel-based alloy composition comprises a nonzero amount up to 10% of the Ru.

7. The turbine blade as recited in claim 1, wherein said nickel-based alloy composition comprises a nonzero amount up to 10% of the Rh.

8. The turbine blade as recited in claim 1, wherein said nickel-based alloy composition comprises a nonzero amount up to 10% of the Pd.

9. The turbine blade as recited in claim 1, wherein said nickel-based alloy composition comprises a nonzero amount up to 10% of the Os.

10. The turbine blade as recited in claim 1, wherein said nickel-based alloy composition comprises a nonzero amount up to 10% of the Ir.

11. The turbine blade as recited in claim 1, wherein said nickel-based alloy composition comprises a nonzero amount up to 10% of the Pt.

12. The turbine blade as recited in claim 1, wherein the base metal has a single grain structure.

13. The turbine blade as recited in claim 1, wherein the base metal has a columnar grain structure with a primary direction aligned with said primary direction of the turbine blade.

14. An aircraft engine comprising:
   a fan;
   a compressor in at least partial fluid communication with said fan;
   a combustor in fluid communication with said compressor portion; and
   a turbine in fluid communication with said combustor, said turbine comprising a rotor having a plurality of high modulus turbine blades that have a primary direction that extends from a base portion to a tip portion of said plurality of high modulus turbine blades, said plurality of high modulus turbine blades being formed of a base metal that has a crystallographic orientation, and said crystallographic orientation having a high modulus direction, wherein said high modulus direction is aligned with said primary direction and is within either about ten degrees of the <112> crystallographic direction or about ten degrees of the <123> crystallographic direction, wherein said base metal is a nickel-based alloy composition comprising 1-16% Cr, a nonzero amount of 0-3% Mo, 3-13% W, a nonzero amount of 0-8% Re, a nonzero amount up to 14% Ta, 3-7% Al, a nonzero amount up to 20% Co, a nonzero amount up to 2% Hf, a nonzero amount up to 2% Ti, up to 2% Nb, up to 1% V, a nonzero amount up to 10% of at least one of Ru, Rh, Pd, Os, Ir, or Pt, and a nonzero amount up to 0.25% Y, and the balance Ni.

15. The aircraft engine as recited in claim 14, wherein said high modulus direction is aligned within about ten degrees of said primary direction.

16. The aircraft engine as recited in claim 14, wherein said base metal comprises recrystallized grains.

17. A method of tuning the natural vibration frequency of a turbine blade comprising the step of:
   increasing an elastic modulus in a primary direction of the turbine blade comprising 1-16% Cr, a nonzero amount of 0-3% Mo, 3-13% W, a nonzero amount of 0-8% Re, a nonzero amount up to 14% Ta, 3-7% Al, a nonzero amount up to 20% Co, a nonzero amount up to 2% Hf, a nonzero amount up to 2% Ti, up to 2% Nb, up to 1% V, a nonzero amount up to 10% of at least one of Ru, Rh, Pd, Os, Ir, or Pt, and a nonzero amount up to 0.25% Y, and the balance Ni, wherein the primary direction is a direction that extends from a base portion to a tip portion of the turbine blade; and
   aligning said high modulus direction with said primary direction, wherein said high modulus direction is within either about ten degrees of the <112> crystallographic direction or about ten degrees of the <123> crystallographic direction.

* * * * *